United States Patent [19]
Conn et al.

[11] Patent Number: 5,418,690
[45] Date of Patent: May 23, 1995

[54] MULTIPLE WIRING AND X SECTION PRINTED CIRCUIT BOARD TECHNIQUE

[75] Inventors: Robert B. Conn, Johnson City; Darleen Mayo, Endwell; Thurston B. Youngs, Jr., Vestal, all of N.Y.

[73] Assignee: International Business Machines Corporation, Armonk, N.Y.

[21] Appl. No.: 309,554

[22] Filed: Sep. 20, 1994

Related U.S. Application Data

[63] Continuation of Ser. No. 74,547, Jun. 11, 1993, abandoned.

[51] Int. Cl.6 ............................................. H05K 1/02
[52] U.S. Cl. ................................. 361/794; 174/250; 174/255; 361/792; 361/795
[58] Field of Search ............... 174/250, 255, 262; 361/792, 794, 795

[56] References Cited

U.S. PATENT DOCUMENTS

| | | | |
|---|---|---|---|
| 3,436,819 | 4/1969 | Lunine | 29/628 |
| 3,516,156 | 6/1970 | Steranko | 29/627 |
| 3,616,532 | 11/1971 | Beck | 29/615 |
| 4,659,931 | 4/1987 | Schmitz et al. | 250/336 |
| 4,755,911 | 7/1988 | Suzuki | 361/414 |
| 4,849,284 | 7/1989 | Arthur et al. | 428/325 |
| 4,967,314 | 10/1990 | Higgins, III | 361/414 |
| 5,012,047 | 4/1991 | Dohya | 174/250 |

*Primary Examiner*—Gerald P. Tolin
*Assistant Examiner*—L. Thomas
*Attorney, Agent, or Firm*—Douglas M. Clarkson

[57] ABSTRACT

Multiple circuit functions embodied in electrical circuit lines and areas are supported by a multilayered printed circuit board of various lengths and widths (defining "x" and "y" directions) and of various thicknesses (defining a "z" direction) all on a single board. Several ways of achieving such variations in thickness include providing two layer subassemblies arranged in an alternate and intermediate manner, one subassembly being adapted to support electrical circuit lines and areas, and the other subassembly being formed of thin film dielectric material of various precalculated thicknesses. Another way of achieving a variation in thickness is to limit the surface covered by circuit lines with a pre-calculated core thickness.

10 Claims, 4 Drawing Sheets

MULTIPLE WIRING AND X SECTION PRINTED CIRCUIT BOARD TECHNIQUE

This is a continuation of 08/074,547 Jun. 11, 1993, now abandoned.

BACKGROUND OF THE INVENTION

1. Field of the Invention

The invention, generally, relates to packaging techniques for printed circuit boards and, more particularly, to a technique for mixing various wiring technologies with various cross section thicknesses in the same printed circuit board.

Today, it is common throughout industry to use separate printed circuit boards for each function to be performed within a particular system. This practice has developed largely due to cost and performance factors, since different functions require different cross section and wiring technologies.

The practice that is common today does not permit the degree of flexibility in circuit construction and arrangement that cost and performance packaging requires. Input/Output circuits alone require performance considerations that lower cost connectors do not provide.

An example of the trend that is prevalent today is to construct printed circuit boards of several electrically conductive layers with alternate layers of a dielectric material. Interconnections between layers are provided by vias that are coated with electrically conductive material, such as copper.

It has been found that use of a multilayered structure for a printed circuit board provides substantial flexibility, particularly in supercomputer environments. Connections between the respective electrical circuits and components still must be accomplished by using conductive vias.

2. Description of the Prior Art

U.S. Pat. No. 3,436,819 to Lunine describes a multilayer laminate circuit board having various circuit configurations on different planes with a method of making interconnections at the various planes for internal operations and for contact to the surface of the multilayer laminate.

U.S. Patent No. 3,516,156 to Steranko describes electrical voltage packaging technique which permits an electrical voltage on one or more planes buried within the package to be brought out to the surface of the package with a connection insulated from the intervening layers.

U.S. Pat. No. 4,659,931 to Schmitz et al. discloses a multilayered module formed of thin film non-conductive layers as well as layers having conductive patterns arranged to effect electrical connections between devices and to the surface of the module as an electrical interconnect system.

U.S. Pat. No. 5,012,047 to Dohya describes a multilayer wiring substrate with signal layers on the top and bottom connected together and to selected internal layers by vias so that the external layers function as bonding pads for connecting leads and as lands for Input/Output pins.

While these prior arrangements may be effective for their stated purposes, what is needed today is a packaging technique that will permit multiple wiring cross sections combined in a multiple cross section structure. It is to this end that the present invention is directed.

Moreover, when the packaging technique of the invention is utilized as will be described in detail presently, it provides other advantages not available and not even contemplated by the prior arrangements.

OBJECTS AND SUMMARY OF THE INVENTION

Accordingly, it is a principal object of the present invention to provide a packaging technique for printed circuit boards that admits a mixing of wiring technologies with different cross section configurations.

An important object of the present invention is to provide a packaging technique that admits combining different cross sections and wiring configurations within a single printed circuit board structure.

It is also an object of the present invention to provide a new and improved packaging for printed circuit boards to obtain a reduction in cost and an increase in circuit performance.

Briefly, a printed circuit board that is constructed and arranged in accordance with the principles of the present invention combines within the same structure different regions of different purpose which involve different cross sectional thicknesses.

The above and other objects, advantages and features of the present invention will become more apparent from the following detailed description of the presently preferred embodiment as illustrated in the accompanying drawings.

DETAILED DESCRIPTION OF THE INVENTION

In the structure of a printed circuit board that is available today, each layer of copper is dedicated to a specific signal or power function. This permits one and only one operating or functional designation for each level within a cross section and, therefore, only one operational function for each printed circuit board.

For the structure of a printed circuit board in accordance with the present invention, each layer or level is available for multiple operating functions, such as, signal, power or dielectric. This will be described in more detail as the present description proceeds.

Figure 1:
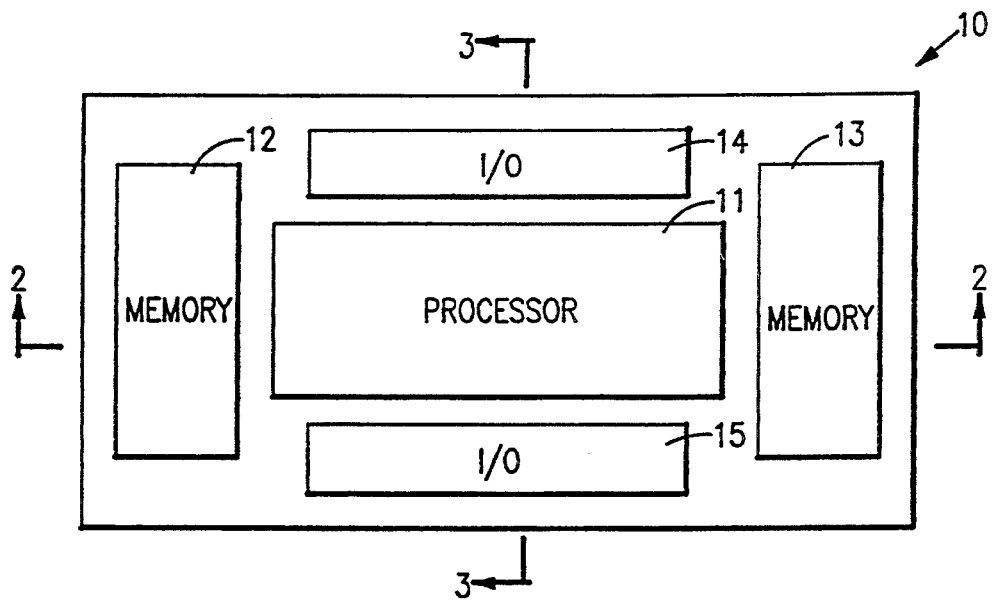
FIG. 1 is a top or plan view of a typical printed circuit board, with several circuit components, as an aid in describing the present invention, that identifies "x" and "y" directions.

In FIG. 1 of the drawings, a relatively simple printed circuit board 10 is illustrated with mixed electrical and operating components, such as, a processor 11, two memory components 12 and 13 and two Input/Output (I/O) components 14 and 15. Each of these functional operating components is available with a single printed circuit board that is arranged structurally according to the present invention.

With the printed circuit board 10, there are no complicated and costly connections necessary between the various operating components, and the more direct connections that it provides permit a performance enhancement on both the internal and the external planes that previously could only be dreamed of as being accomplished some day in the future.

Figure 2:
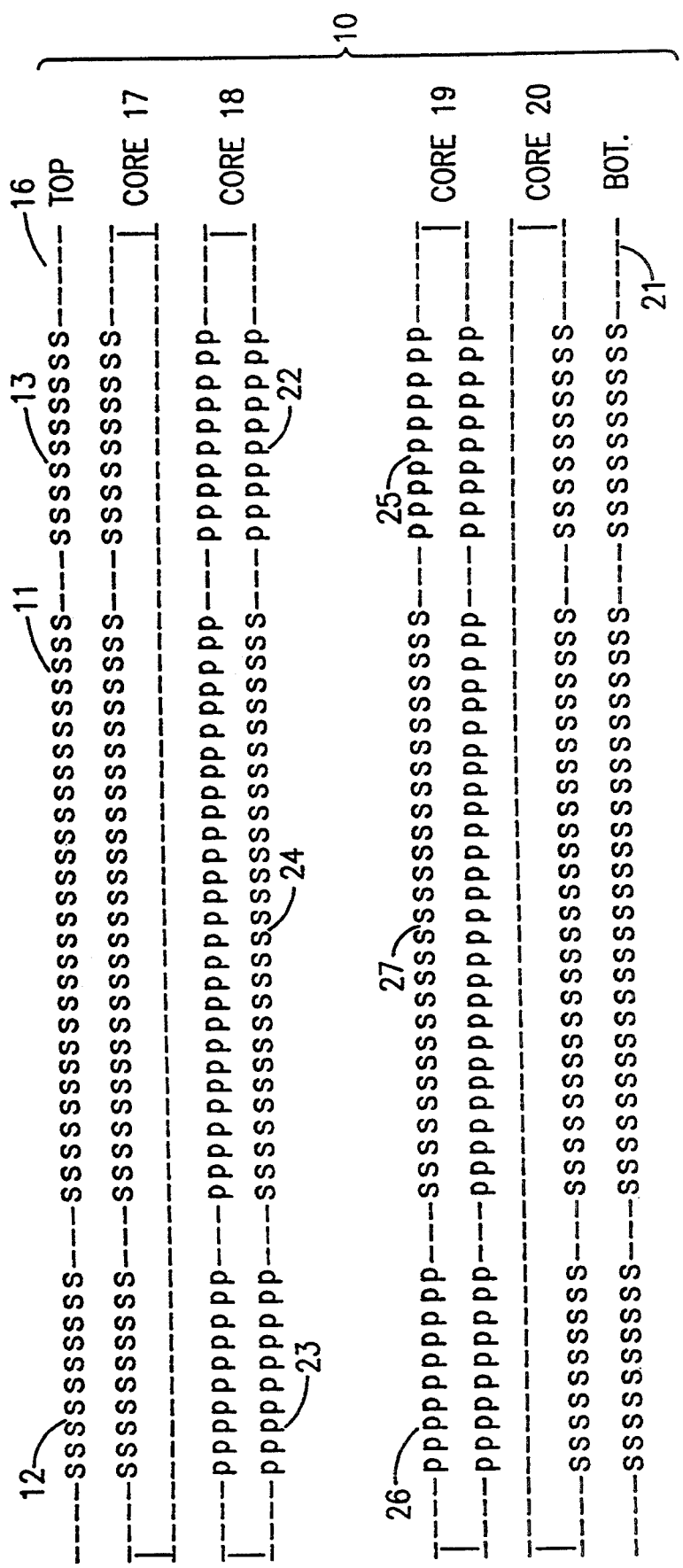
FIG. 2 is a view of the "z" direction as seen along the line 2—2 in the "x" direction in FIG. 1, illustrating a structure according to the invention.

In FIG. 2 of the drawings, a vertical cross section in the "z" direction of the printed circuit board 10 is illustrated in more detail as an aid in the description of one form of construction. Of course, the particular construction to be given now is only one, presently preferred, way of forming a printed circuit board.

There is available commercially today epoxy material that is as thin as 0.0018 inch thick, or expressed more generally as 1.8 mils thick. The commercial availability of such material is the only limitation for this dielectric material. This will be described in more detail presently.

Since FIG. 2 is a vertical view along the line 2—2 in FIG. 1 which is a view of the printed circuit board 10 in the "z" direction, the processor 11, and the respective memory components 12 and 13 now are illustrated on a top layer 16 of the printed circuit board 10. A series of small "s"'s indicate a thickness of copper, or other electrically conductive material, on a surface of the dielectric film that forms the top layer 16.

A core 17 is one of several cores 18, 19 and 20 with patterns of copper lines. A bottom layer 21 is illustrated on the bottom of the lower core 20. Therefore, the printed circuit board 10 is formed of the top layer 16, the cores 17 through 20 and the bottom layer 21. There are intervening layers of a dielectric material, but these will be described in more detail hereinafter.

Also seen in this figure are the various power circuit areas that are intermixed with circuit lines. For example, note that power circuit areas 22 and 23 at the lower surface of the core 18 are located with signal lines 24 and that these lines are spaced from lines 25, 26 and 27 in a comparable circuit pattern at the top surface of the core 19.

Figure 3:
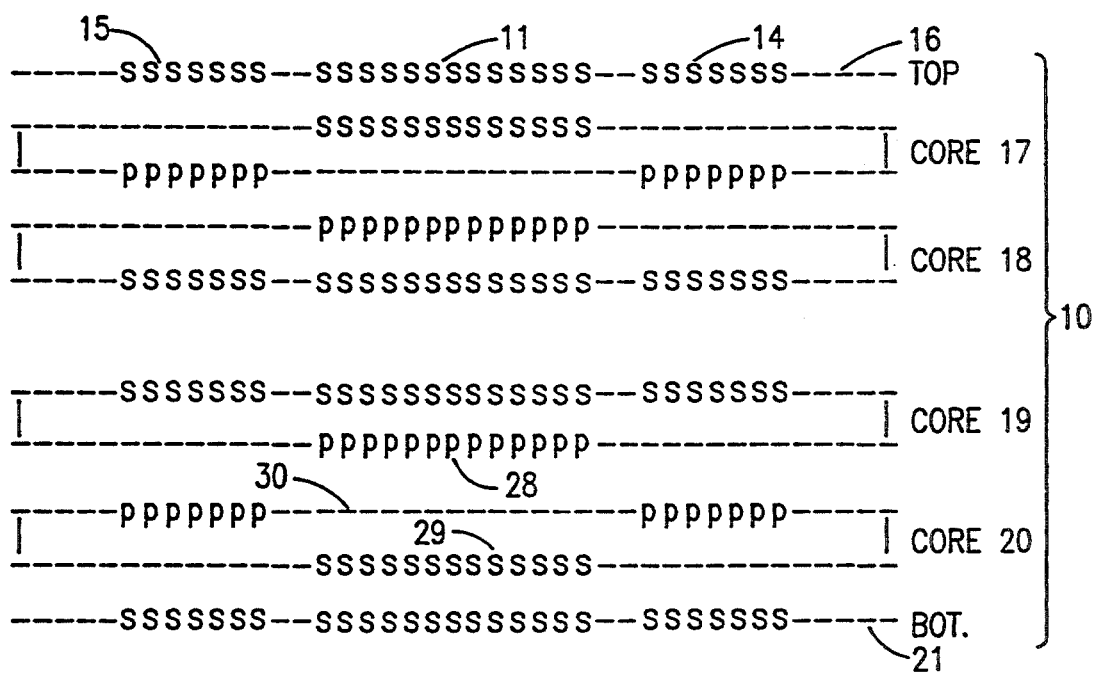
FIG. 3 is a view of the "z" direction as seen along the line 3—3 in the "y" direction in FIG. 1, illustrating the present invention.

Before a description of a more complete printed circuit board, according to the invention, note that in FIG. 3 of the drawings, the same printed circuit board 10 is illustrated along line 3—3 in FIG. 1. Also, in this view, the top layer 16 reveals the circuit lines 14, 11 and 15 as seen looking from top to bottom in FIG. 1.

A particular feature that is available with a printed circuit board that is constructed and arranged in accordance with the principles of the invention is illustrated in both of these FIGS. 2 and 3. Note in FIG. 3 that a power circuit area 28, in any particular pattern, is spaced from a signal circuit line 29 not only by a blank space 30 at the top surface of the core 20, but also by the precalculated thickness of an intervening dielectric layer. This will become clearer as the description proceeds.

In circuit packaging, the performance requirements of a printed circuit board are dictated by the various components and devices being integrated in the package. It is customary to require low noise in the operation of such packages and to require a minimum of delay for a signal to travel between two points.

These circuit packaging requirements can be controlled by the spacing between various conductors and other components. For example, the thickness of a dielectric between a signal plane and a power plane can produce a dramatic affect on noise.

Not all components and devices on a printed circuit board are noise sensitive. Memory and I/O circuits are in this category, but these components are impedance sensitive, which are controlled by the packaging arrangement also. In most situations, the impedance characteristics of a printed circuit board are determined by the impedance of the components supported on the board, and usually such components have different impedances.

Of course, many things have a bearing on impedance, other than the particular metal selected for a conductor. One of these is the spacing between conductor elements as well as dimensions of each conductor. In calculating a particular arrangement for a printed circuit board, the optimization of its performance is an iterative consideration that involves such features as width of a conductor, its height, spacing and also the thickness of the surrounding dielectric materials.

All of the above described factors develop an inductance and capacitance matrix for each printed circuit board, and clearly, it is a complex matter. However, it is from such a matrix that all electrical performance characteristics of each printed circuit board are determined, such as noise, impedance, time delay, etc.

It is from an analysis as described above that mechanical parameters are determined for meeting the electrical performance requirements of the components and devices to be packaged on a particular printed circuit board. In other words, a compromise must be made between high density wiring for memory circuits and the increased noise it produces and the low noise requirements of other components on the printed circuit board.

There are other compromises that usually are involved also, the one given above being only an example. Because of the impact of such compromises, it is the custom in the industry today to package certain components and devices, such as the processor 11, the memory 12 and 13 and the I/O 14 and 15, FIG. 1, on separate printed circuit boards and interconnecting them through the usual complex connection arrangements.

Now, however, a printed circuit board in accordance with the invention provides the capability of mixing multiple functions on a single printed circuit board in such a way as to optimize performance. This is provided by varying conductor widths and spacings not only in the customary "x" and "y" directions but, also, in the "z" direction, which is the thickness.

The above described general description is defined more specifically by dividing a cross section into a sufficient number of layers to support wiring planes for the particular circuit to function normally. A presently preferred way that this is done is by varying the dielectric thickness between signal and power planes as will be illustrated in more detail.

The number of layers that this arrangement develops is sufficient to permit enough wiring planes within the printed circuit board, and these wiring planes now are sub-divided or personalized into areas of power, signal and open area, which are spaces without electrical conductors. For wiring planes where electrical conduction is required, such as power or signal, the customary variations of conductor widths and spacings are formed, determined by performance requirements.

The layers that support circuits are formed by the usual process involving lamination, and the dielectric material used is of a thickness and dielectric constant that the particular circuit requires. Copper foil of different thicknesses is bonded to those layers where it will be needed, much like it is done today, by photo-lithographic techniques.

Figure 4:
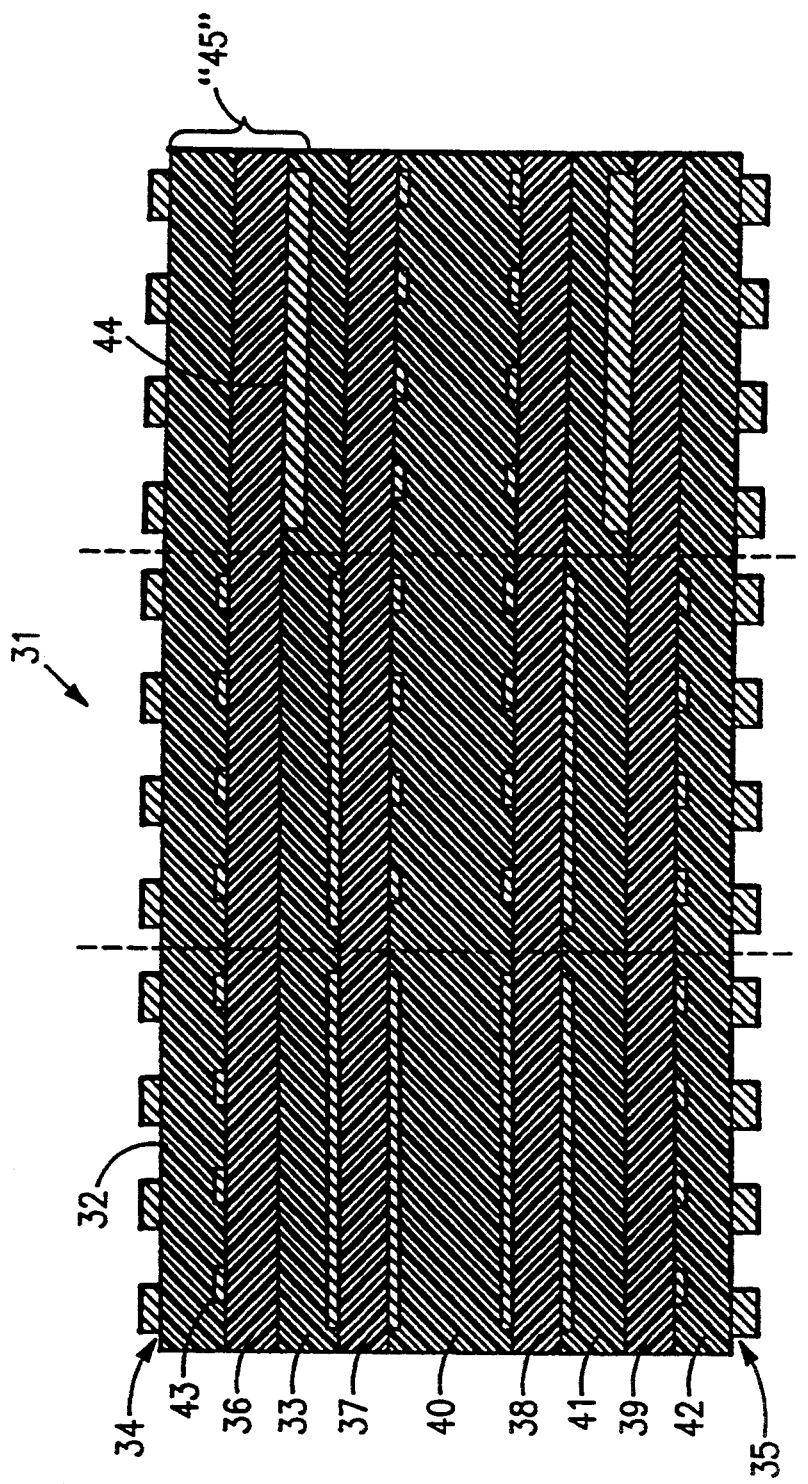
FIG. 4 is a vertical cross sectional view, in the "z" direction, in exaggerated dimensions, to show a printed circuit board that is constructed in accordance with the principles of the present invention.

Now, to describe in more detail the additional flexibility that the present invention provides in the construction of printed circuit boards, reference is made to FIG. 4 of the drawings. A particular printed circuit board 31 is illustrated having four cores, each with different thickness. For example, core 36 can have a thickness of 0.198 mils, and core 37 can have a thickness of 0.132 mils, as an illustration.

A top area 34 and a bottom area 35 are copper circuits formed into external electrical conductors. The intermediate layers 36, 37, 38, and 39 identify cores of dielectric material, each a precalculated thickness in the printed circuit board 31.

The alternate layers, indicated by the numerals 32, 33, 40, 41, and 42, are formed of dielectric material, and these can be provided by thin films of such material each having a precalculated thickness. As an example, the thickness of these alternate dielectric layers can be 5.7 mils.

In this FIG. 4, the cross sectional view of the printed circuit board 31 that is constructed according to the invention is illustrated with actual conductive circuit lines, illustrated by the numeral 34 on the top dielectric layer 32 and by 35 on the bottom dielectric layer 42.

For this particular printed circuit board 31, electrically conductive circuit lines 43 are located at the lower side of the top layer 32 covering only part of that side. Then, between the top layer 32 and a next layer 33 is the dielectric spacing core 36 with its conductive circuit 44.

As described previously, the thickness of each respective ones of these layers 32, 33, 40, 41 and 42 is calculated to provide, in accordance with the invention, a needed thickness in the "z" direction. In addition, the dielectric spacing cores 36, 37, 38 and 39 each are calculated in thickness to provide a spacing that the particular printed circuit board components require in the performance of its functional requirements. Note the particular spacing "45" between the circuit line 34 and a power circuit area 44.

Figure 5:
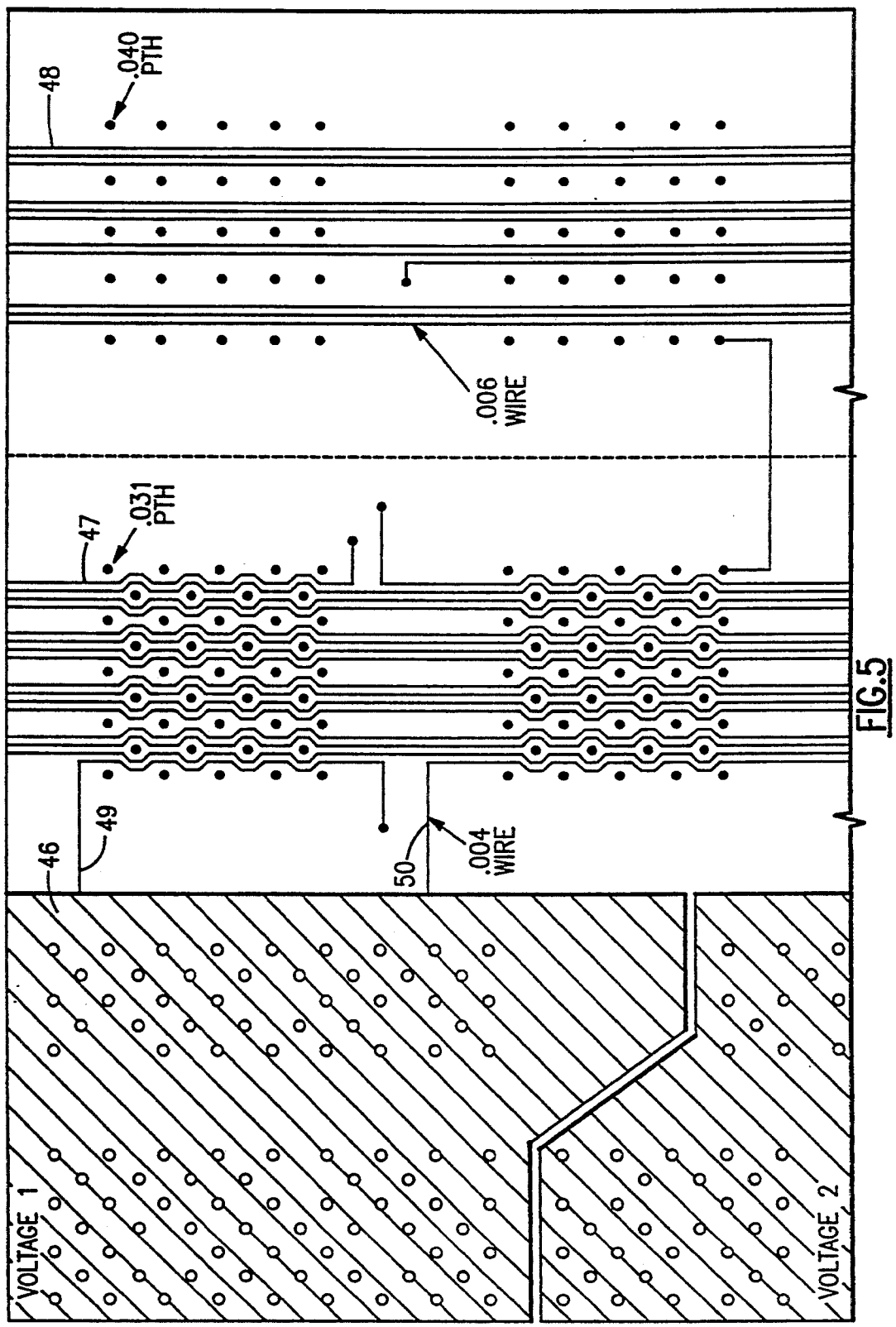
FIG. 5 is an enlarged plan view of a printed circuit board that includes features that are available in a structure that is in accordance with the invention.

As illustrated in FIG. 5, a power voltage area 46, and two circuit lines 47 and 48 have pre-calculated line widths and configurations in the "x" and "y" directions, for their particular functions. The area 46 is formed for conducting a "voltage 1", indicated by a legend on the area 46.

The line 47 is formed of a different width and a different configuration, with connections 49 and 50 to the voltage area 46. By separate legends on FIG. 5, the conductive line 47 is formed of 4 mil wire (or conductive copper), and the line 48 is formed of 6 mil wire, which are variations in the "x" and "y" directions.

The invention has been shown, described and illustrated in substantial detail with reference to the presently preferred form of the invention. It will be understood by those skilled in this art that various changes and modifications may be made without departing from the spirit and scope of the invention which is defined by the claims appended hereto.

What is claimed is:

1. A multilayered circuit board assembly including a plurality of subassemblies formed as independent layers, and having electrical circuit lines and power areas on the same level, the improvement comprising:

a first plurality of substrate layers formed of a thin film dielectric material, each being of precalculated thickness in a "z" direction, and each layer being adapted to support electrically conductive circuit lines and areas on predetermined sides and in a predetermined configuration;

at least one substrate layer in said first plurality includes an area of electrically conductive material forming a voltage source and also including electrically conductive circuit lines of predetermined configuration in an "x" and "y" direction; and a second plurality of substrate layers formed of a thin film dielectric material, each layer of said second plurality being formed of a predetermined thickness, and each layer of said second plurality located intermediate adjacent layers of said first plurality;

whereby electrically conductive lines and areas on any layer of said first plurality is spaced a precalculated distance in a "z" direction from any electrically conductive line and area on an adjacent layer of said first plurality.

2. A multilayered circuit board assembly as defined by claim 1 wherein each layer of said first plurality is adapted to support electrically conductive lines and areas on opposite sides.

3. A multilayered circuit board assembly as defined by claim 2 wherein a precalculated thickness for spacing in said "z" direction between said electrically conductive element on one side of a first layer in said first plurality and an electrically conductive element on the same side of an adjacent layer, also in said first plurality, is obtained by arranging said configuration of circuit lines on the side of said first layer opposite said one side to provide an absence of electrically conductive lines.

4. A multilayered circuit board assembly as defined by claim 1 wherein a first substrate layer in said first plurality includes at least one area of electrically conductive material to form a voltage source, said first substrate layer also forming a support for electrically conductive circuit lines, and at least one electrical connection formed on said multilayered circuit board connecting said circuit lines to said one area.

5. A multilayered circuit board assembly having at least two groups of subassemblies each of which is formed as independent layers and predetermined subassemblies, at least one of which having electrical circuit lines, and a power area of predetermined "x" and "y" configuration, the improvement comprising:

a first plurality of layer subassemblies being positioned as alternate layers;

a second plurality of layer subassemblies being positioned as intermediate layers;

said first plurality of layer subassemblies supporting said electrical circuit lines and at least one power area on a predetermined side of said layers in a predetermined "x" and "y" configuration, and each layer subassembly of said second plurality having a predetermined thickness provided by said predetermined "x" and "y" configuration on said first layer subassemblies, for spacing adjacent layer subassemblies of said first plurality a precalculated distance in a "z" direction.

6. A multilayered circuit board assembly as defined by claim 5 including at least one layer subassembly in said first plurality having an area of electrically conductive material forming a voltage source for said electrical circuit lines.

7. A multilayered circuit board assembly as defined by claim 6 including at least one electrically conductive means from one electrical circuit line on the same side of said layer subassembly to electrically connect said voltage source.

8. A multilayered circuit board assembly as defined by claim 6 wherein said voltage source is on the opposite side of said layer subassembly supporting said circuit source, and including at least one electrical connection between said voltage source and an opposite side of said layer subassembly supporting said voltage source.

9. A multilayered circuit board assembly as defined by claim 6 wherein an additional variation in thickness in said z direction is achieved by a predetermined thickness of said layer subassembly of said first plurality.

10. A multilayered circuit board assembly as defined by claim 1 wherein the circuit board is composed of at least two subassemblies.

* * * * *